US008284611B2

(12) United States Patent
Lee

(10) Patent No.: US 8,284,611 B2

(45) Date of Patent: Oct. 9, 2012

(54) VERIFYING AND PROGRAMMING METHOD OF NONVOLATILE MEMORY DEVICE

(75) Inventor: Eun Joung Lee, Chungcheongbuk-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 184 days.

(21) Appl. No.: 12/826,283

(22) Filed: Jun. 29, 2010

(65) Prior Publication Data

US 2010/0329031 A1 Dec. 30, 2010

(30) Foreign Application Priority Data

Jun. 30, 2009 (KR) ........................ 10-2009-0059168

(51) Int. Cl.
*G11C 16/06* (2006.01)

(52) U.S. Cl. ......... 365/185.22; 365/185.03; 365/185.18; 365/185.25

(58) Field of Classification Search ......... 365/185.03 X, 365/185.17, 185.18 X, 185.22 O, 185.25 X, 365/185.03, 185.18, 185.22, 185.25
See application file for complete search history.

(56) References Cited

U.S. PATENT DOCUMENTS

2009/0052243 A1 * 2/2009 Park et al. ................ 365/185.03

FOREIGN PATENT DOCUMENTS

KR 1020080089335 10/2008

OTHER PUBLICATIONS

Notice of Allowance issued from Korean Intellectual Property Office on Jan. 21, 2011.

* cited by examiner

*Primary Examiner* — VanThu Nguyen

(74) *Attorney, Agent, or Firm* — IP & T Group LLP

(57) ABSTRACT

A method of operating a nonvolatile memory device includes precharging bit lines coupled to strings, supplying a first verification voltage to a selected word line and supplying a pass voltage to word lines other than the selected word line, supplying a first sense pulse to switching elements coupled between the bit lines and sense nodes and detecting memory cells, each having a threshold voltage higher than the first verification voltage, supplying a second verification voltage higher than the first verification voltage to the selected word line and supplying the pass voltage to the word lines other than the selected word line, and supplying a second sense pulse to the switching elements and detecting memory cells, each having a threshold voltage higher than the second verification voltage.

15 Claims, 5 Drawing Sheets

VERIFYING AND PROGRAMMING METHOD OF NONVOLATILE MEMORY DEVICE

CROSS-REFERENCE TO RELATED APPLICATION

Priority to Korean patent application number 10-2009-0059168 filed on Jun. 30, 2009, the entire disclosure of which is incorporated by reference herein, is claimed.

BACKGROUND

Exemplary embodiments relate to a method of operating a nonvolatile memory device and, more particularly, to a method of programming a nonvolatile memory device, which can reduce the time taken to perform a verification operation.

Program, erase, read, and verification operations are performed on a nonvolatile memory device.

While the program or erase operation is performed, the verification operation is performed. In particular, as the number of bits of data that are programmed is increased, the time that it takes to perform the verification operation for the program operation increases. The verification operation is described in detail below.

FIG. 1 is a diagram illustrating a nonvolatile memory device.

The nonvolatile memory device includes a memory cell array 10 for storing data, a bit line control circuit 20 for selecting a bit line BLe or BLo, and a page buffer 30 for controlling input and output operations of the data.

The memory cell array 10 includes a plurality of strings Ste and Sto, each including a drain select transistor DST and a source select transistor SST. Each of the strings further includes a plurality of memory cells F0 to Fn coupled in series between the drain select transistor DST and the source select transistor SST. The drains of the drain select transistors DST of the strings are coupled to the bit lines BLe and BLo, respectively, and the sources of the source select transistors SST of the strings are coupled to a common source line CSL in common.

The gates of the drain select transistors DST of the strings are interconnected to a drain select line DSL, and the gates of the source select transistors SST of the strings are interconnected to a source select line SSL. Furthermore, the gates of the memory cells, which are arranged in a row across the strings, i.e., the memory cells Fn, are interconnected to a corresponding word line, i.e., WLn.

The bit line control circuit 20 includes an even switching element 21 and an odd switching element 22. The even switching element 21 is operated in response to an even sense pulse BSLe and configured to select the even bit line BLe. The odd switching element 22 is operated in response to an odd sense pulse BSLo and configured to select the odd bit line BLo.

The page buffer 30 is coupled to a selected one of the bit lines BLe and BLo through the bit line control circuit 20 and configured to verify whether a selected memory cell has been programmed in a verification operation.

FIG. 2 is a diagram illustrating a conventional method of programming a nonvolatile memory device.

An operation of programming the nonvolatile memory device in the case in which the even bit line BLe is selected is described below with reference to FIGS. 1 and 2.

When a program operation is performed, the page buffer 30 precharges or discharges a sense node SO on the basis of data inputted to the page buffer 30. It is preferred that the sense node SO coupled to the string of a cell to be programmed be discharged. When the even switching element 21 is supplied with the even sense pulse BSLe of a logic high level and turned on, the even bit line BLe is discharged to a ground voltage (0 V) level. Here, when a program voltage is supplied to a selected word line Sel. WL, selected memory cells are programmed. A pass voltage is supplied to the remaining word lines other than the selected word line Sel. WL. Through the above-described program operation, each of the threshold voltages of the selected memory cells may rise up to a first target level, a second target level, or a third target level. When the even sense pulse BSLe and the program voltage supplied to the selected word line Sel. WL shift to a logic low level, the program operation is stopped and a verification operation is then performed.

The verification operation is performed to verify whether each of the threshold voltages of the selected memory cells has reached a selected one of the first to third target voltages. Accordingly, the verification operation is performed by supplying different levels of verification voltages according to the respective target levels. More particularly, the memory cell can be in an erase state in which the threshold voltage is lower than 0 V or can be in a program state in which the threshold voltage is higher than 0 V (i.e., a first state PV1, a second state PV2, and a third state PV3 in order of higher threshold voltages). Accordingly, in the verification operation, a first verification operation, a second verification operation, and a third verification operation may be performed.

In order to perform the verification operation, the sense node SO is precharged to a high voltage level.

In the first verification operation, a first verification voltage Vr1 is supplied to the selected word line Sel. WL. The even switching element 21 is turned on in response to the even sense pulse BSLe having a first sense pulse (V1) level. Here, the first sense pulse V1 is a signal for a bit line precharge pulse. The precharged sense node SO and the even bit line BLe are coupled together, and then the even bit line BLe is also precharged to a high voltage level on the basis of a potential of the precharged sense node SO. More particularly, the even bit line BLe is precharged to a voltage (V1-Vt) level. Here, a voltage Vt is the threshold voltage of the even switching element 21.

When the even bit line BLe is precharged and the even sense pulse BSLe becomes a low logic level, the even switching element 21 is turned off. During the time for which the even switching element 21 is turned off, the even bit line BLe can have a different voltage level (A or B) according to threshold voltage levels of the selected memory cells. For example, if the selected memory cells have threshold voltages lower than a first target level in the first verification operation, a channel is formed on the selected memory cells and so the voltage level of the even bit line BLe is lowered by a grounded common source line CSL (B). Meanwhile, if the selected memory cells have threshold voltages higher than the first target level, a channel is not formed on the selected memory cells and so the voltage level of the even bit line BLe remains intact (A). And then, the even sense pulse BSLe becomes a second sense pulse (V2) level, and the page buffer 30 senses a shift in the voltage level of the even bit line BLe in the second verification operation.

Meanwhile, in each of the second verification operation and the third verification operation, the sense operation is performed after a corresponding bit line is precharged. Accordingly, the time that it takes to perform the verification operation may be increased.

BRIEF SUMMARY

Exemplary embodiments relate to a method of operating a nonvolatile memory device, in which verification operations for memory cells are consecutively performed after a bit line is precharged once, thereby being capable of reducing the time that it takes to perform the verification operations.

Furthermore, exemplary embodiments relate to a method of operating a nonvolatile memory device, in which in the case in which the voltage level of a precharged bit line is lowered due to a leakage current in a program verification operation, a sense pulse shifts to a low voltage level and the program verification operation is then performed, thereby being capable of improving the reliability of the program verification operation.

A method of operating a nonvolatile memory device according to an embodiment of the present invention comprises precharging bit lines coupled to strings supplying a first verification voltage to a selected word line and supplying a pass voltage to word lines other than the selected word line, supplying a first sense pulse to switching elements coupled between the bit lines and sense nodes and detecting memory cells, each having a threshold voltage higher than the first verification voltage, supplying a second verification voltage higher than the first verification voltage to the selected word line and supplying the pass voltage to the word lines other than the selected word line, and supplying a second sense pulse to the switching elements and detecting memory cells, each having a threshold voltage higher than the second verification voltage.

A method of programming a nonvolatile memory device comprising a plurality of strings, bit lines coupled to the respective strings, and switching elements coupled between a sense node and the respective bit lines according to another embodiment of the present invention comprises programming selected memory cells of the string, precharging the bit lines, supplying a first verification voltage to a selected word line coupled to the selected memory cells, supplying a first sense pulse to the switching elements, and detecting memory cells, each having a threshold voltage higher than the first verification voltage, by sensing an amount of charges transferred to the sense node, supplying a second verification voltage higher than the first verification voltage to the selected word line, supplying a second sense pulse to the switching elements, and detecting memory cells, each having a threshold voltage higher than the second verification voltage, by sensing the amount of charges transferred to the sense node, and supplying a third verification voltage higher than the second verification voltage to the selected word line, supplying a third sense pulse to switching elements, and detecting memory cells, each having a threshold voltage higher than the third verification voltage, by detecting the amount of charges transferred to the sense node.

A method of operating a nonvolatile memory device according to yet another embodiment of the present invention comprises precharging bit lines coupled to strings, supplying a first verification voltage to a selected word line of the strings, sensing the bit lines in response to a first sense pulse to verify a memory cell of the selected word line is programmed in a first state, supplying a second verification voltage higher than the first verification voltage to the selected word line of the strings, and sensing the bit lines in response to a second sense pulse to verify the memory cell of the selected word line is programmed in a second state

DESCRIPTION OF EMBODIMENTS

Hereinafter, some exemplary embodiments of the present disclosure will be described in detail with reference to the accompanying drawings. The figures are provided to facilitate understanding of the exemplary embodiments of the disclosure by those of ordinary skill in the art.

Figure 1:
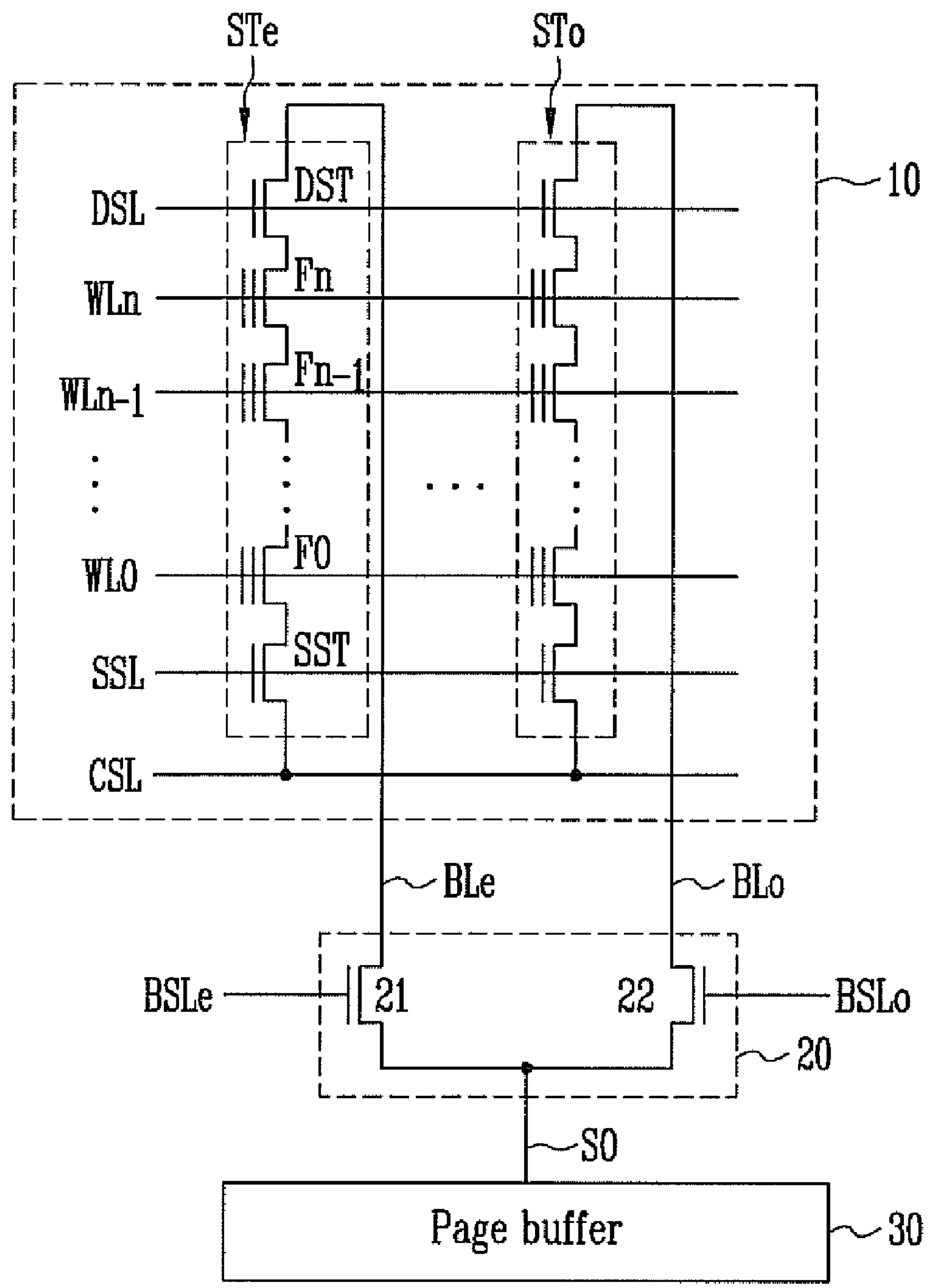
FIG. 1 is a diagram illustrating a nonvolatile memory device.
Figure 2:
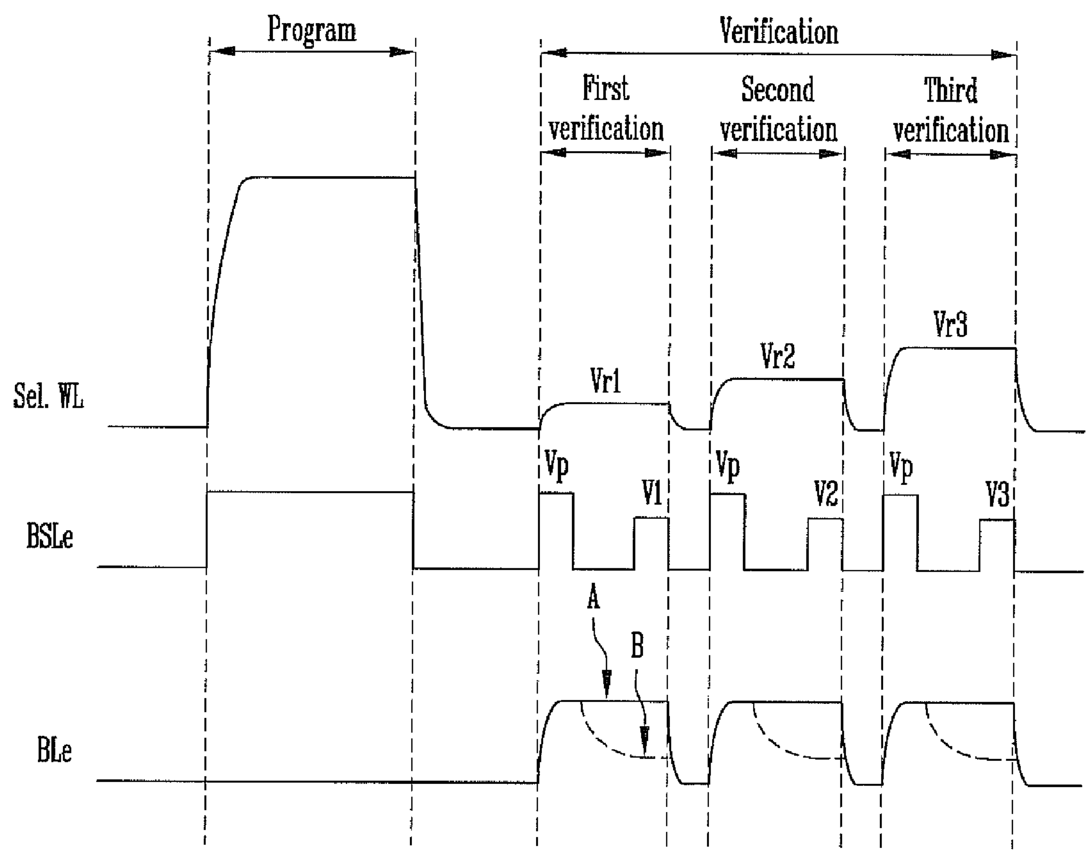
FIG. 2 is a diagram illustrating a conventional method of programming the nonvolatile memory device.
Figure 3:
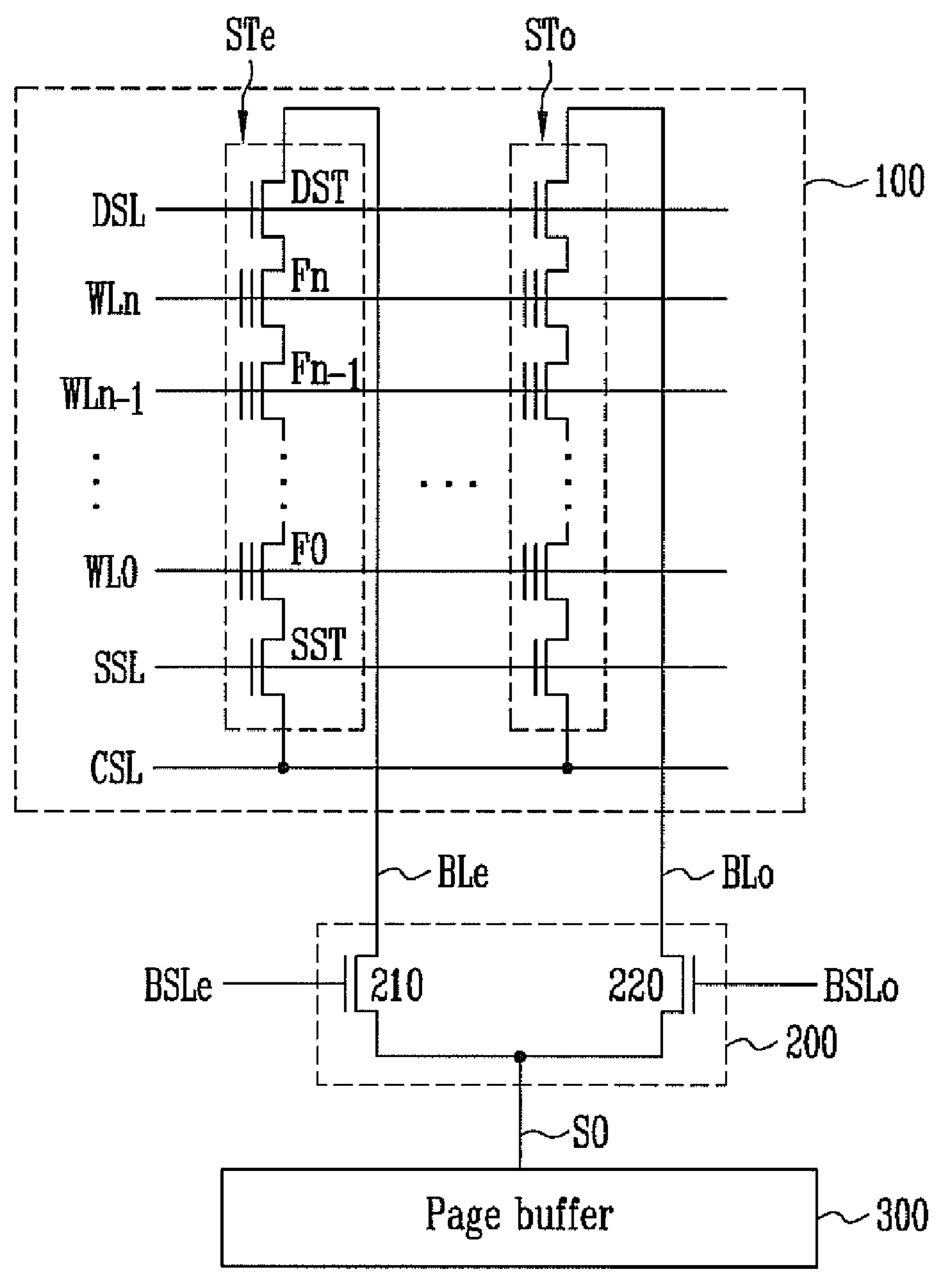
FIG. 3 is a diagram illustrating a nonvolatile memory device.

FIG. 3 is a diagram illustrating a nonvolatile memory device.

The nonvolatile memory device includes a memory cell array 100 for storing data, a bit line control circuit 200 for selecting a bit line BLe or BLo, and a page buffer 300 for controlling input and output operations of the data.

The memory cell array 100 includes a plurality of strings Step and Sto, each including a drain select transistor DST and a source select transistor SST. Each of the strings further includes a plurality of memory cells F0 to Fn coupled in series between the drain select transistor DST and the source select transistor SST. The drains of the drain select transistors DST of the strings are coupled to the bit lines BLe and BLo, respectively, and the sources of the source select transistors SST of the strings are coupled to a common source line CSL in common.

The gates of the drain select transistors DST of the strings are interconnected to a drain select line DSL, and the gates of the source select transistors SST of the strings are interconnected to a source select line SSL. Furthermore, the gates of the memory cells, which are arranged in a row across the strings, i.e., the memory cells Fn, are interconnected to a corresponding word line, i.e., WLn.

The bit line control circuit 200 includes an even switching element 210 and an odd switching element 220. The even switching element 210 is operated in response to an even sense pulse BSLe and configured to select the even bit line BLe. The odd switching element 220 is operated in response to an odd sense pulse BSLo and configured to select the odd bit line BLo.

The page buffer 300 is coupled to a selected one of the bit lines BLe and BLo through the bit line control circuit 200 and configured to verify whether a selected memory cell is programmed in a verification operation.

Figure 4:
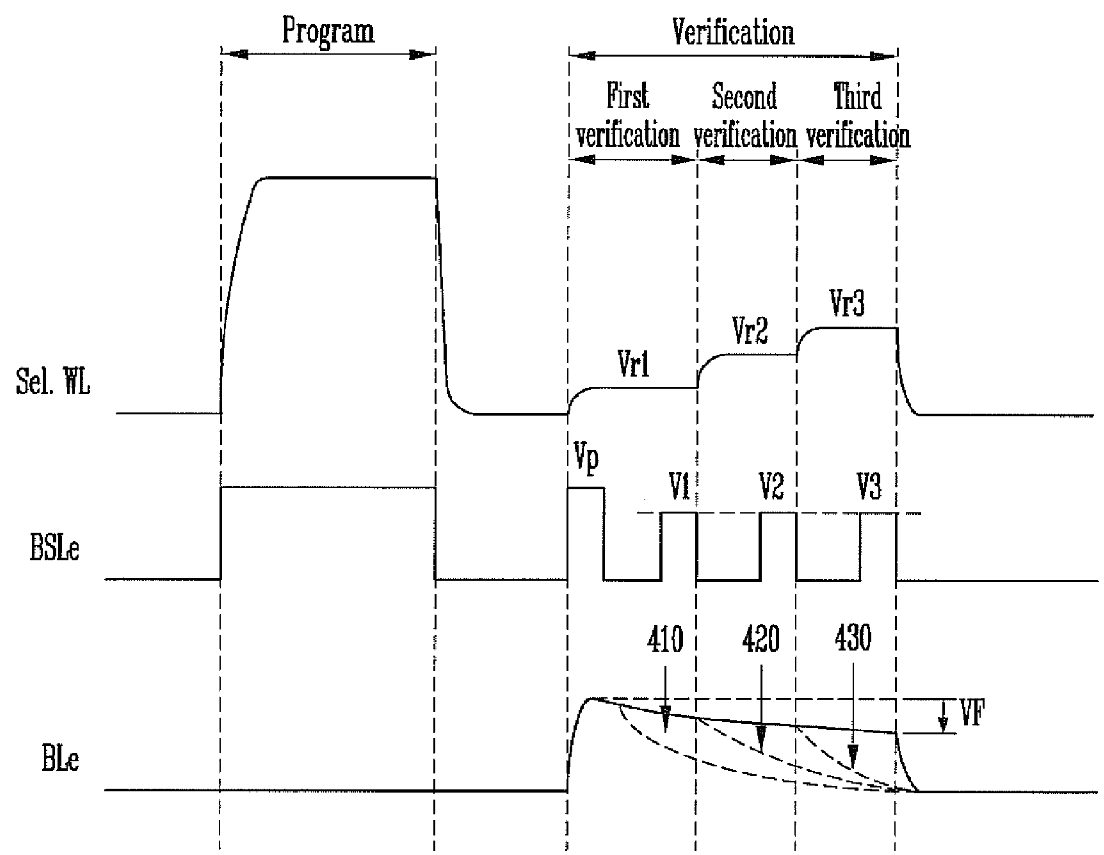
FIG. 4 is a diagram illustrating a method of programming the nonvolatile memory device in accordance with an embodiment of the present invention.

FIG. 4 is a diagram illustrating a method of programming the nonvolatile memory device in accordance with an embodiment of the present invention.

A program method of raising the threshold voltages of memory cells to first to third target levels is described below with reference to FIGS. 3 and 4.

A program operation comprises a program step of raising the threshold voltages of selected memory cells to a target level and a program verification step of verifying threshold voltage levels of the selected memory cells. In the program step, a selected sense node SO is discharged and a sense node other than the selected one is precharged to a program-inhibited voltage. In the case that the even bit line BLe is selected, when the even sense pulse BSLe becomes in a logic high level, the even bit line BLe is discharged. Other bit lines are precharged to the program-inhibited voltage (e.g., Vdd). The threshold voltages of selected memory cells are raised by supplying a program voltage to a selected word line Sel. WL, and a program pass voltage is supplied to word lines other than the selected one.

When the even sense pulse BSLe shifts to a logic low level after the threshold voltages of the selected memory cells are raised, the even switching element 210 is turned off. At this time, a program voltage is supplied to the selected word line Sel. WL shifts to a logic low level. Next, a program verification operation is performed. In the case of a multi-level cell (MLC) programmed with a plurality of threshold voltages, the program verification operation preferably is performed for every threshold voltage level. That is, the program verification operation is performed on memory cells having threshold voltages to be raised to the first target level using a first verification voltage Vr1, memory cells having threshold voltages to be raised to the second target level using a second verification voltage Vr2, and memory cells having threshold voltages to be raised to the third target level using a third verification voltage Vr3.

Anterior to the program verification operation, the sense node SO is precharged to a high voltage level. When the even sense pulse BSLe becomes a precharge voltage (Vp) level, the even switching element 210 is turned on. Accordingly, the sense node SO and the even bit line BLe are coupled together, and so the even bit line BLe is precharged.

In the program verification operation, the first verification operation, the second verification operation, and the third verification operation can be consecutively performed. The first verification operation is performed by supplying the first verification voltage Vr1 to the selected word line Sel. WL with the sense node SO precharged. The second verification operation is performed by supplying the second verification voltage Vr2 to the selected word line Sel. WL to which the first verification voltage Vr1 is supplied. The third verification operation is performed by supplying the third verification voltage Vr3 to the selected word line Sel. WL to which the second verification voltage Vr2 is supplied. Each of the first to third verification operations is described in more detail below.

The first verification operation is performed to verify whether the threshold voltage of a memory cell has reached the level of a first state PV1 (i.e., the first target level). The first verification voltage Vr1 is supplied to the selected word line Sel. WL, and a verification pass voltage is supplied to word lines other than the selected one. As described above, when the even sense pulse BSLe becomes the precharge voltage (Vp) level, the even switching element 210 is turned on. Accordingly, the precharged sense node SO and the selected even bit line BLe are coupled together, and so the even bit line BLe is precharged to a high voltage level.

After the even bit line BLe is precharged, the even sense pulse BSLe shifts to a logic low level, and so the even switching element 210 is turned off. During the time for which the even switching element 210 is turned off, the selected memory cells are verified. At that time, the voltage level of the precharged even bit line BLe can remain intact or can be lowered according to the threshold voltage levels of the selected memory cells. More particularly, if the threshold voltages of the selected memory cells are lower than the first target level of the first verification operation, a channel is formed on the selected memory cells. Accordingly, the voltage level of the even bit line BLe is lowered (410). However, if the threshold voltages of the selected memory cells are higher than the first target level of the first verification operation, a channel is not formed on the selected memory cells. Accordingly, the voltage level of the even bit line BLe remains intact. Here, the first target level can be adjusted in response to a voltage supplied to the selected word line Sel. WL, i.e. the first verification voltage Vr1. During the time for which the selected memory cells are verified, both the drain select transistor DST and the source select transistor SST remain turned on, and the common source line CSL is grounded.

Next, in order to sense a voltage level of the even bit line BLe, the even sense pulse BSLe of a first sense pulse (V1) level is supplied to the even switching element 210. If the threshold voltages of the selected memory cells are lower than the first target level and thus the voltage level of the even bit line BLe is lowered, the lowered voltage level of the even bit line BLe is transferred to the sense node SO, which changes a voltage level of the sense node SO. The page buffer 300 determines whether the threshold voltages of the selected memory cells have reached the first target voltage on the basis of the voltage level of the sense node SO. If the voltage level of the even bit line BLe is maintained to a precharge voltage level because the threshold voltages of the selected memory cells are higher than the first target level, the voltage level of the sense node SO is also maintained. Accordingly, if the voltage level of the sense node SO is maintained, the page buffer 300 determines that the threshold voltages of the selected memory cells have reached the first target level. After the first verification operation is performed, the even sense pulse BSLe supplied as the first sense pulse (V1) level shifts to a logic low level.

The second verification operation is performed to verify whether the threshold voltages of the selected memory cells have reached the second target voltage. More particularly, the second verification voltage Vr2 is supplied to the selected word line Sel. WL to which the first verification voltage Vr1 is supplied, and the verification pass voltage is supplied to word lines other than the selected one. Next, without precharging the sense node SO, the even sense pulse BSLe shifts to a second sense pulse (V2) level, and the even switching element 210 is turned on. Accordingly, a voltage level of the even bit line BLe is sensed. Here, the second sense pulse V2 may have the same level as the first sense pulse V1 which is used during the first verification operation. Consequently, the page buffer 300 determines whether the threshold voltages of the selected memory cells have reached the second target level by sensing a shift in the voltage level of the sense node SO.

The third verification operation is performed in the same manner as the second verification operation, but the third verification voltage Vr3 is supplied to the selected word line Sel. WL. In the third verification operation, the even sense pulse BSLe having a third sense pulse (V3) level the same as that used in the first and second verifications may be supplied.

After the sense node SO is once precharged as described above, a precharged voltage is continuously used during the program verification operation. Accordingly, the time that it takes to perform the program verification operation can be reduced.

Meanwhile, during the time for which the program verification operation is performed, the leakage current may be generated in the even bit line BLe, the active region of the string, and the memory cells. Even if the threshold voltages of selected memory cells are programmed to be higher than a target voltage, a program operation may be determined to be incomplete in a program verification operation, because a voltage level of the even bit line BLe is lowered by the leakage current. In particular, if the leakage current is generated, the amount of the leakage current is likely to increase in verification operations subsequent to a first verification operation. Consequently, the reliability of the program verification operation may be deteriorated. Accordingly, the program verification operation in accordance with an embodiment of the present invention can be performed as follows.

Figure 5:
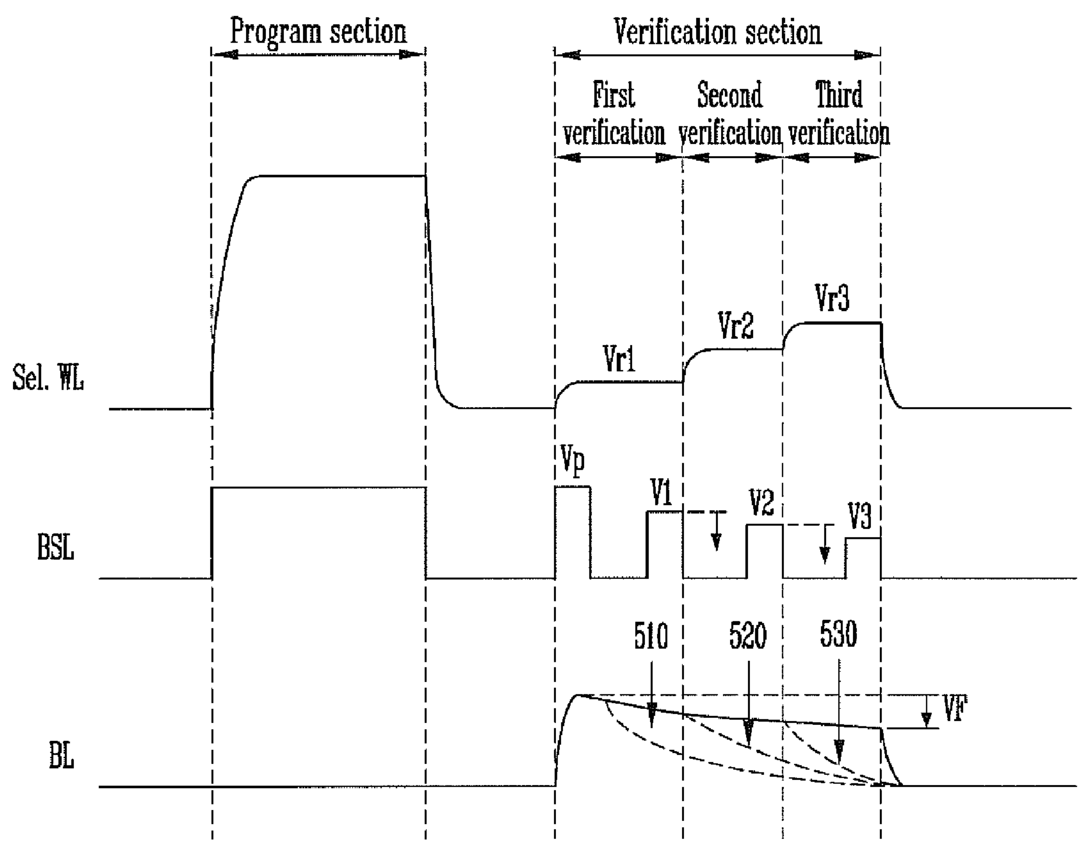
FIG. 5 is a diagram illustrating a method of programming a nonvolatile memory device in accordance with another embodiment of the present invention.

FIG. 5 is a diagram illustrating a method of programming a nonvolatile memory device in accordance with another embodiment of the present invention.

An operation of programming the nonvolatile memory device is described below with reference to FIGS. 3 and 5.

The program operation comprises a program step of raising the threshold voltages of selected memory cells and a verification step of verifying the threshold voltages of the selected memory cells.

In the program step, the sense node SO is supplied with a ground voltage (e.g., 0 V) and the selected bit line BL is also supplied with the ground voltage through the sense node SO. When a program voltage is supplied to a selected word line Sel. WL, the threshold voltages of the selected memory cells rise. In this case, a program-inhibited voltage (e.g., Vdd) is supplied to bit lines other than the select bit line, and a program pass voltage is supplied to word lines other than the selected word line.

After the threshold voltages of the memory cells rise, the sense pulse BSL becomes a logic low level, and a voltage of a logic low level is also supplied to the selected word line Sel. WL. Next, a program verification operation is performed. In the case of a multi-level cell (MLC) programmed with a plurality of threshold voltages, the program verification operation is performed for every threshold voltage level. More particularly, the program verification operation includes a first verification operation, a second verification operation, and a third verification operation. In particular, before the program verification operation is performed, the sense node SO is precharged to a high voltage level.

In particular, in the program verification operation, after the selected bit line BL is precharged once, the first verification operation, the second verification operation, and the third verification operation can be consecutively performed. The first verification operation is performed by supplying a first verification voltage Vr1 to the selected word line Sel. WL with the sense node SO precharged. The second verification operation is performed by supplying a second verification voltage Vr2 to the selected word line Sel. WL to which the first verification voltage Vr1 is supplied. The third verification operation is performed by supplying a third verification voltage Vr3 to the selected word line Sel. WL to which the second verification voltage Vr2 is supplied. Each of the first to third verification operations is described in more detail below.

The first verification operation is performed to verify whether the threshold voltages of the selected memory cells have reached a first target voltage. The first verification voltage Vr1 is supplied to the selected word line Sel. WL, and a verification pass voltage is supplied to word lines other than the selected on. When the sense pulse BSL becomes a precharge voltage (Vp) level, a precharged sense node SO and the selected bit line BL are electrically coupled together through a turned-on switching element. Thus the selected bit line BL is precharged to a high voltage level. After the selected bit line BL is precharged, the sense pulse BSL is disabled to a logic low level to turn off the switching element. During the time for which the switching element is turned off, both the drain select transistor DST and the source select transistor SST remain turned-on.

Accordingly, during the above-discussed time, the voltage level of the precharged bit line BL can be changed according to threshold voltages of the selected memory cells. For example, if the threshold voltages of the selected memory cells are lower than the first target voltage, i.e., the first verification voltage Vr1, a channel is formed on the selected memory cells, and thus the voltage level of the bit line BL is lowered (510).

Meanwhile, if the threshold voltages of the selected memory cells are higher than the first target voltage, a channel is not formed on the selected memory cells, and so the bit line BL remains in the precharge voltage level. Here, the first target voltage may shift in response to the first verification voltage Vr1 supplied to the selected word line Sel. WL.

In order to sense a voltage level of the bit line BL, a first sense pulse V1 is supplied to the switching element as the sense pulse BSL. The bit line BL and the sense node SO are coupled together in response to the first sense pulse V1. For example, if the voltage level of the bit line BL is lowered because the threshold voltages of the selected memory cells are lower than the first target voltage, the lowered voltage level of the bit line BL is transferred to the sense node SO, which changes a voltage level of the sense node SO. The page buffer 300 determines that the threshold voltages of the selected memory cells have not reached the first target voltage by sensing a shift in the voltage level of the sense node SO.

However, if the voltage level of the bit line BL remains in the precharge voltage level because the threshold voltages of the selected memory cells are higher than the first target voltage, the sense node SO also remain in a precharge state.

However, if a leakage current is generated in the bit line BL, the voltage level of the bit line BL that should remain in the precharge voltage level may be lowered.

Accordingly, during the sense operation of the first verification operation, it is preferred that the sense pulse BSL supplied to the switching element has a first sense pulse (V1) level which is lowered from the sense pulse level of FIG. 4 by an average of voltage levels of the bit line BL lowered due to a leakage current. In exemplary embodiments, during the first verification operation, the amount of a leakage current of the bit line BL is measured and the first sense pulse (V1) level may be lowered by the measured value.

Through such a sense operation, if the threshold voltages of the selected memory cells are higher than the first target voltage, although the voltage supplied to the bit line BLe is lowered due to a leakage current, the page buffer 300 can sense that the voltage level of the sense node SO is maintained and thus can determine that the threshold voltages of the selected memory cells have reached the first target voltage. After the first verification operation is performed, the sense pulse BSL shifts to a logic low level.

The second verification operation is performed to verify whether the threshold voltages of the selected memory cells have reached a second target voltage. More particularly, the second verification voltage Vr2 is supplied to the selected word line Sel. WL to which the first verification voltage Vr1 is supplied, and the verification pass voltage is supplied to word lines other than the selected one. Next, a voltage level of the bit line BL is sensed by supplying the sense pulse BSL of a second sense pulse (V2) level to the switching element without precharging the sense node SO. In this case, it is preferred that the level of the second sense pulse V2 is lower than the level of the first sense pulse V1 because the voltage level of the bit line BLe may become lower at the second verification than the first verification operation due to a leakage current. For example, by finding an average decrement of the bit line BL during verification operations, a second sense pulse V2, lower than the first sense pulse V1 supplied in the first verification operation by the average decrement, can be used. Accordingly, the page buffer 300 can sense a shift in the voltage level of the sense node SO according to the threshold voltages of the selected memory cells although a leakage current is generated in the bit line BL and can determine whether the threshold voltages of the selected memory cells have reached the second target voltage.

In the third verification operation, a sense operation is performed by supplying the sense pulse BSL, having a third sense pulse (V3) level lower than that of the second sense pulse V2 supplied in the second verification operation by an average decrement in voltages supplied to the bit line BL with consideration taken of a case in which a leakage current is generated in the bit line BL.

In the case in which a program operation is performed using an increment step pulse program (ISPP) method, the above verification operation can be performed when an operation of supplying a program voltage to a selected word line and verifying the program operation is performed.

As described above, after the sense node SO is precharged once, a precharged voltage is used during a program verification operation without charging again. Accordingly, the time that it takes to perform the program verification operation can be reduced.

Furthermore, although the precharged voltage in the bit line BL is lowered by a leakage current, an error in a verification operation resulting from the leakage current can be prevented, because a lowered voltage level of the sense pulse BSLe or BSLo is supplied in each verification operation. Consequently, the reliability of a nonvolatile memory device can be improved.

In accordance with an exemplary embodiment of the present invention, during a program verification operation, after the bit line is precharged once, a sense pulse is consecutively supplied. Accordingly, the time that it takes to perform a program verification operation can be reduced. Although a voltage level of a precharged bit line is reduced due to a leakage current, the reliability of a program verification operation can be improved by gradually decreasing levels of the sense pulses.

What is claimed is:

1. A verifying method of a nonvolatile memory device, the method comprising:

precharging bit lines coupled to strings;

supplying a first verification voltage to a selected word line and supplying a pass voltage to word lines other than the selected word line;

supplying a first sense pulse to switching elements coupled between the bit lines and sense nodes and detecting memory cells, each having a threshold voltage higher than the first verification voltage;

supplying a second verification voltage higher than the first verification voltage to the selected word line and supplying the pass voltage to the word lines other than the selected word line; and supplying a second sense pulse to the switching elements and detecting memory cells, each having a threshold voltage higher than the second verification voltage, wherein a voltage level of the second sense pulse is lower than a voltage level of the first sense pulse.

2. The verifying method of claim 1, wherein the detecting of the memory cells by the first and second sense pulses is sequentially performed without performing precharging of the bit lines again.

3. The verifying method of claim 1, wherein the detecting of the memory cells with the first verification voltage comprises verifying memory cells programmed in a first state from selected memory cells coupled to the selected word line.

4. The verifying method of claim 1, wherein the detecting of the memory cells with the second verification voltage comprises verifying memory cells programmed in a second state from selected memory cells coupled to the selected word line.

5. The verifying method of claim 1, wherein the memory cells, each having the threshold voltage higher than the second verification voltage, are programmed in a third state.

6. The verifying method of claim 1, wherein the voltage level of the second sense pulse is lower than the voltage level of the first sense pulse by a potential of each of the precharged bit lines, which is reduced due to a leakage current during a verification operation.

7. The verifying method of claim 1, wherein the detecting of the memory cells with the first and second verification voltages is performed by sensing an amount of charges transferred from the bit lines to the sense nodes through the switching elements.

8. A programming method of a nonvolatile memory device comprising a plurality of strings, bit lines coupled to the respective strings, and switching elements coupled between a sense node and the respective bit lines, the method comprising:

programming selected memory cells of the string;

precharging the bit lines;

supplying a first verification voltage to a selected word line coupled to the selected memory cells, supplying a first sense pulse to the switching elements, and detecting memory cells, each having a threshold voltage higher than the first verification voltage, by sensing an amount of charges transferred to the sense node;

supplying a second verification voltage higher than the first verification voltage to the selected word line, supplying a second sense pulse to the switching element, and detecting memory cells, each having a threshold voltage higher than the second verification voltage, by sensing an amount of charges transferred to the sense node; and supplying a third verification voltage higher than the second verification voltage to the selected word line, supplying a third sense pulse to the switching element, and detecting memory cells, each having a threshold voltage higher than the third verification voltage, by detecting an amount of charges transferred to the sense nod, wherein the first to third sense pulses are set to be gradually lowered.

9. The programming method of claim 8, wherein the supplying of the first to third verification voltages comprises supplying a pass voltage to word lines other than the selected word line.

10. The programming method of claim 8, wherein the detecting of the memory cells with the first verification voltage comprises detecting memory cells programmed in a first state from the selected memory cells.

11. The programming method of claim 8, wherein the detecting of the memory cells with the second verification voltage comprises detecting memory cells programmed in a second state from the selected memory cells.

12. The programming method of claim 8, wherein the detecting of the memory cells with the third verification voltage comprises detecting memory cells programmed in a third state from the selected memory cells.

13. The programming method of claim 8 wherein the first to third sense pulses are set to be gradually lowered based on a magnitude of a voltage of the bit line, wherein the voltage of the bit line is reduced due to a leakage current.

14. A verifying method of a nonvolatile memory device, the method comprising:

precharging bit lines coupled to strings;

supplying a first verification voltage to a selected word line of the strings;

sensing the bit lines in response to a first sense pulse to verify a memory cell of the selected word line is programmed in a first state;

supplying a second verification voltage higher than the first verification voltage to the selected word line; and sensing the bit lines in response to a second sense pulse to verify the memory cell of the selected word line is programmed in a second state, wherein the second sense pulse is lower than the first sense pulse.

15. The verifying method of claim 14 wherein the sensing of the bit lines in response to the second sense pulse is performed without precharging the bit lines.

* * * * *